United States Patent
Carl

(10) Patent No.: US 10,620,542 B2
(45) Date of Patent: Apr. 14, 2020

(54) OPTICAL SYSTEM OF A MICROLITHOGRAPHIC PROJECTION EXPOSURE SYSTEM OR OF A WAFER INSPECTION SYSTEM

(71) Applicant: Carl Zeiss SMT GmbH, Oberkochen (DE)

(72) Inventor: Michael Carl, Aalen (DE)

(73) Assignee: Carl Zeiss SMT GmbH, Oberkochen ( * ) Notice: Subject to any disclaimer, the term of this patent is extended or adjusted under 35 U.S.C. 154(b) by 0 days.

(21) Appl. No.: 15/972,567

(22) Filed: May 7, 2018

(65) Prior Publication Data

US 2018/0253013 A1 Sep. 6, 2018

Related U.S. Application Data

(63) Continuation of application No. PCT/EP2016/077210, filed on Nov. 10, 2016.

(30) Foreign Application Priority Data

Dec. 2, 2015 (DE) .................. 10 2015 223 982

(51) Int. Cl.
*G03F 7/20* (2006.01)
*G02B 3/00* (2006.01)
(Continued)

(52) U.S. Cl.
CPC ..... *G03F 7/70308* (2013.01); *G01N 21/8806* (2013.01); *G01N 21/9501* (2013.01);
(Continued)

(58) Field of Classification Search
CPC ............. G03F 7/70308; G03F 7/70566; G03F 7/70191; G03F 7/7065; G01N 2021/8848;
(Continued)

(56) References Cited

U.S. PATENT DOCUMENTS 6,252,712 B1  6/2001 Fürter et al.
8,031,326 B2 10/2011 Totzeck et al.
(Continued)

FOREIGN PATENT DOCUMENTS

CN       1495472 A   5/2004
DE  10 2005 033 564 A1  2/2007
(Continued)

OTHER PUBLICATIONS

International Preliminary Report on Patentability, with translation thereof, for corresponding Appl No. PCT/EP2016/077210, dated Jun. 14, 2018.
(Continued)

*Primary Examiner* — Deoram Persaud
(74) *Attorney, Agent, or Firm* — Fish & Richardson P.C.

(57) ABSTRACT

The disclosure relates to an optical system of a microlithographic projection exposure apparatus or of a wafer inspection apparatus having a first retardation manipulator, a second retardation manipulator, and a manipulator for displacing the second retardation manipulator independently of the first retardation manipulator in at least one direction that is transverse to the optical system axis of the optical system. The second retardation manipulator leaves the wavefront of light that passes through it during operation of the optical system unchanged. In a specified starting position of the first retardation manipulator and of the second retardation manipulator, the sum of the retardations caused by the first retardation manipulator and the second retardation manipulator coincides for all rays that travel parallel to the optical system axis during operation of the optical system.

19 Claims, 7 Drawing Sheets

(51) Int. Cl.
  *G02B 27/28* (2006.01)
  *G01N 21/88* (2006.01)
  *G01N 21/95* (2006.01)
  *G02B 5/30* (2006.01)

(52) U.S. Cl.
  CPC ......... *G02B 3/0081* (2013.01); *G02B 27/286* (2013.01); *G03F 7/7065* (2013.01); *G03F 7/70191* (2013.01); *G03F 7/70566* (2013.01); *G01N 2021/8848* (2013.01); *G02B 5/3083* (2013.01)

(58) Field of Classification Search
  CPC ........... G01N 21/8806; G01N 21/9501; G02B 5/3083
  See application file for complete search history.

(56) References Cited

U.S. PATENT DOCUMENTS

| | | | |
|---|---|---|---|
| 8,294,991 | B2 | 10/2012 | Mueller et al. |
| 9,411,245 | B2 | 8/2016 | Saenger et al. |
| 9,651,872 | B2* | 5/2017 | Feldmann ............ G03F 7/70258 |
| 9,995,850 | B2* | 6/2018 | Maleev ............ G01N 21/9501 |
| 2007/0014504 | A1 | 1/2007 | Fiolka |
| 2008/0174759 | A1* | 7/2008 | Schuster ............ G02B 5/3091 355/71 |
| 2009/0115989 | A1 | 5/2009 | Tanaka |
| 2010/0231888 | A1 | 9/2010 | Mueller et al. |
| 2011/0069296 | A1 | 3/2011 | Gruner et al. |
| 2015/0029480 | A1* | 1/2015 | Schlesener ........... G03F 7/70116 355/67 |

FOREIGN PATENT DOCUMENTS

| | | |
|---|---|---|
| DE | 10 2008 040 613 A1 | 1/2009 |
| DE | 10 2007 055 567 A1 | 5/2009 |
| JP | H11-271680 A | 10/1999 |
| JP | 2007-515768 A | 6/2007 |
| JP | 2007-189079 A | 7/2007 |
| JP | 2011-508409 A | 3/2011 |
| JP | 2015-505169 A | 2/2015 |
| WO | WO 2007/055120 A1 | 5/2007 |

OTHER PUBLICATIONS

German Office Action, with translation thereof, for corresponding DE Appl No. 10 2015 223 982.9, dated Aug. 9, 2016.

International Search Report for corresponding Appl No. PCT/EP2016/077210, dated Mar. 28, 2017.

JPO—Office Action, with translation thereof, for corresponding JP Appl No. 2018-528698, dated May 27, 2019.

* cited by examiner

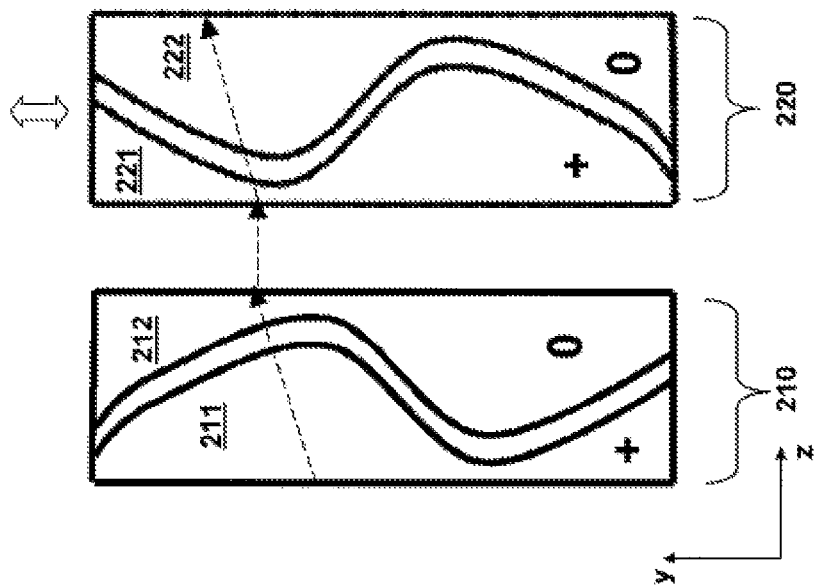
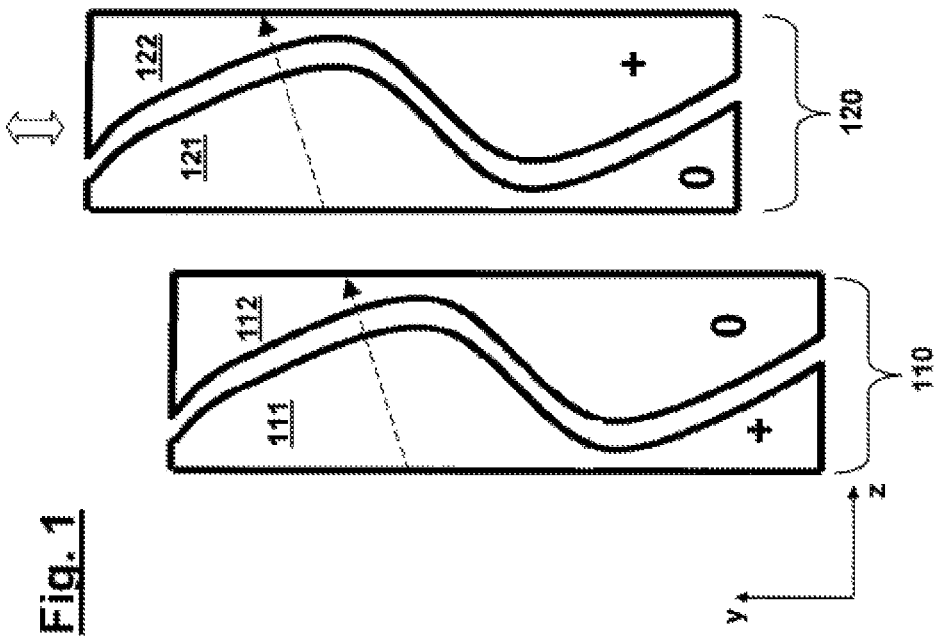

OPTICAL SYSTEM OF A MICROLITHOGRAPHIC PROJECTION EXPOSURE SYSTEM OR OF A WAFER INSPECTION SYSTEM

CROSS-REFERENCE TO RELATED APPLICATIONS

The present application is a continuation of, and claims benefit under 35 USC 120 to, international application PCT/EP2016/077210, filed Nov. 10, 2016, which claims benefit under 35 USC 119 of German Application No. 10 2015 223 982.9, filed on Dec. 2, 2015. The entire disclosure of these applications are incorporated by reference herein.

FIELD

The disclosure relates to an optical system of a microlithographic projection exposure apparatus or of a wafer inspection apparatus.

BACKGROUND

Microlithography is used for producing microstructured components such as, for example, integrated circuits or LCDs. The microlithography process is carried out in what is called a projection exposure apparatus, which includes an illumination device and a projection lens. The image of a mask (=reticle) illuminated via the illumination device is projected via the projection lens onto a substrate (e.g. a silicon wafer) coated with a light-sensitive layer (e.g. photoresist) and arranged in the image plane of the projection lens, in order to transfer the mask structure to the light-sensitive coating of the substrate.

Further optical systems used in microlithography also include inspection systems e.g. in the form of a mask inspection system (for inspecting reticles, or masks, for use in a projection exposure apparatus) or of a wafer inspection apparatus (for observing and testing wafer surfaces). A wafer inspection apparatus has an epi-illumination microscope, the objective of which images the wafer plane onto a TDI sensor or a camera, wherein the image data are examined numerically for deviations from a predetermined image to check the microlithographic imaging result.

Various approaches have been developed both for the illumination device and for the lens of a microlithographic projection exposure apparatus or the objective of an inspection microscope in order to selectively influence the polarization state and the wavefronts of the eigen-polarizations and the difference between them, what is referred to as retardation, or to compensate for existing disturbances.

However, in practice, the problem occurs that an initially set polarization state or a retardation can be changed in an undesired manner. The responsible influences include in particular time-variable birefringence effects such as what is known as the polarization-induced birefringence (PDB), birefringence as a result of time-variable stresses, compaction in non-crystalline material (e.g. quartz glass) of optical components, degradations and thermal effects and also birefringence, present in anti-reflective or highly reflective layers on the optical components, as a result of form birefringence or due to different Fresnel reflection and transmission for orthogonal polarization states.

Merely exemplary background references include DE 10 2007 055 567 A1 and DE 10 2008 040 613 A1.

SUMMARY

The disclosure seeks to provide an optical system of a microlithographic projection exposure apparatus or of a wafer inspection apparatus, which also makes possible the compensation of time-dependent birefringence effects or retardations while avoiding parasitic wavefront effects that accompany the compensation.

In one aspect, the disclosure provides an optical system of a microlithographic projection exposure apparatus or of a wafer inspection apparatus. The optical system has an optical system axis. The optical system includes: a first retardation manipulator; a second retardation manipulator; and a manipulator for displacing the second retardation manipulator independently of the first retardation manipulator in at least one direction that is transverse to the optical system axis. The second retardation manipulator leaves the wavefront of light that passes through it during operation of the optical system unchanged. In a specified starting position of the first retardation manipulator and of the second retardation manipulator, the sum of the retardations caused by the first retardation manipulator and the second retardation manipulator coincides for all rays that travel parallel to the optical system axis during operation of the optical system.

The disclosure is based in particular on the concept of providing for the compensation of an undesired system retardation an arrangement of two retardation manipulators which, although being displaceable in terms of their relative position to one another, in a specified starting position with respect to one another do not change the retardation of light that passes through the two retardation manipulators, or change it only by a value that is constant over the light beam cross section (such that the starting position forms, as it were, a "zero position"). At the same time, an undesired, possibly time-variable system retardation can be compensated by changing the relative position of the two retardation manipulators with respect to one another by way of displacing the second retardation manipulator in a direction that is transverse to the optical system axis. To this end, the retardation manipulators can have, as explained in more detail below, in each case aspheric surfaces such that the retardation effect on light that passes through the respective retardation manipulator can be described as a derivative of a function that describes the relevant aspheric surface after the relative movement. Due to the relative movement of the retardation manipulators, it is thus possible, as a result, to set a linear combination of two fixed retardation profiles—and thereby compensate for a profile of an undesired system retardation which is possibly scaling in its amplitude over time.

Due to the fact that the second retardation manipulator, which is displaceable in a direction that is transverse relative to the optical system axis, is embodied such that it leaves the wavefront of light passing through it during operation of the optical system unchanged, it is ensured that the previously described setting of different retardations by way of the displacement of the second retardation manipulator is not accompanied by an undesired, parasitic wavefront change.

The retardation manipulator which is referred to here as "second retardation manipulator" can also be arranged upstream of the first retardation manipulator with respect to the light propagation direction.

The disclosure is thus suitable for compensating a profile of an undesired system retardation that is to be corrected in the optical system and fluctuates in terms of its amplitude over time (e.g. because the relevant system retardation is radiation-induced or caused by possibly time-variable mechanical stresses) because according to the disclosure, any desired linear combination of two specified retardation distributions is settable.

According to an embodiment, a retardation which exists at another location in the optical system is at least partially compensated for by the arrangement of the first retardation manipulator and the second retardation manipulator.

According to an embodiment, the sum of the retardations effected by the first retardation manipulator and the second retardation manipulator is zero or an integer multiple of the operating wavelength.

According to an embodiment, the manipulator is designed for displacing the second retardation manipulator in two mutually perpendicular directions that are each transverse to the optical axis.

According to an embodiment, the first retardation manipulator has a first partial element and a second partial element.

According to an embodiment, the second retardation manipulator has a third partial element and a fourth partial element.

According to an embodiment, in each case one of the partial elements of the relevant retardation manipulator is embodied such that it effects a retardation for light passing through it, and the respectively other partial element of the relevant retardation manipulator is embodied such that it effects no retardation, or only negligible retardation, for light passing through it.

According to an embodiment, the partial elements of the relevant retardation manipulator mutually compensate each other in terms of their wavefront effect.

According to an embodiment, the partial elements in the relevant retardation manipulator each have mutually facing aspheric surfaces which have a constant distance from one another along the optical system axis.

According to an embodiment, in each case one of the partial elements in the relevant retardation manipulator is produced from optically uniaxial crystal material with an orientation of the optic axis that is perpendicular to the optical system axis.

According to an embodiment, the relevant partial element in the first retardation manipulator and the relevant partial element in the second retardation manipulator have orientations of the optic axis that are perpendicular to one another.

According to an embodiment, in each case one of the partial elements of the first retardation manipulator and of the second retardation manipulator is produced from optically uniaxial crystal material with an orientation of the optic axis that is parallel to the optical system axis.

According to an embodiment, at least one of the retardation manipulators has a non-planar light entry surface.

According to an embodiment, at least one of the retardation manipulators has a coating for bringing about the retardation.

The disclosure furthermore relates to a microlithographic projection exposure apparatus, to a wafer inspection apparatus and to a method for microlithographic production of microstructured components.

Further configurations of the disclosure can be gathered from the description and the dependent claims.

BRIEF DESCRIPTION OF THE DRAWINGS

The disclosure is explained in greater detail below on the basis of exemplary embodiments illustrated in the accompanying drawings, in which:

FIG. 1 shows a schematic illustration of an arrangement for compensating an undesired system retardation in accordance with a first embodiment of the disclosure;

FIGS. 2-8 show schematic illustrations for explaining further embodiments of the disclosure.

DETAILED DESCRIPTION OF EXEMPLARY EMBODIMENTS

Figure 4:
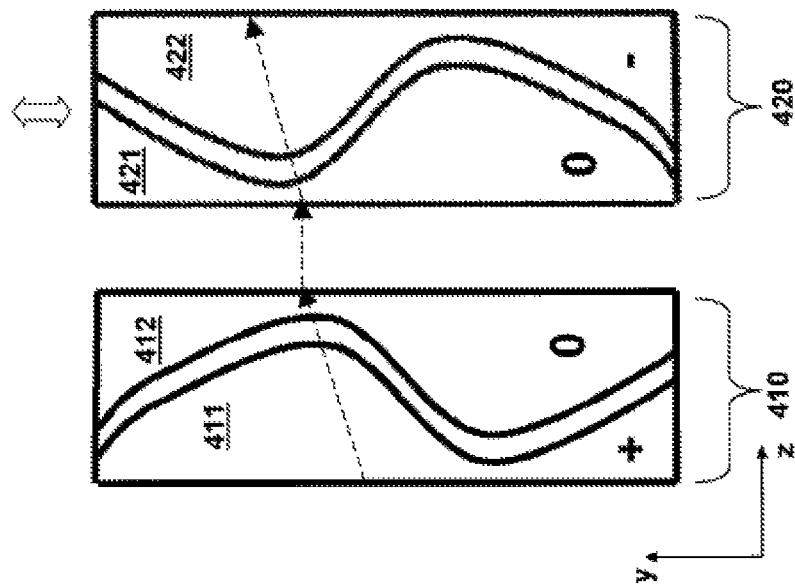

First, the concept according to the disclosure will be explained below with reference to the first embodiment illustrated schematically in FIG. 1.

According to FIG. 1, an arrangement according to the disclosure for compensating an undesired system retardation includes a first retardation manipulator 110 and a second retardation manipulator 120, which are displaceable in terms of their relative position with respect to one another by way of the second retardation manipulator 120 being displaceable in the direction that is perpendicular to the optical system axis or light propagation direction (=z-direction in the indicated coordinate system). The second retardation manipulator 120 in accordance with FIG. 1 is preferably displaceable both in the x-direction and in the y-direction.

In the exemplary embodiment in accordance with FIG. 1, the first retardation manipulator 110 has a first partial element 111 and a second partial element 112, and the second retardation manipulator 120 has a third partial element 121 and a fourth partial element 122. As is likewise indicated in FIG. 1, the partial elements 111, 112 of the first retardation manipulator 110 and the partial elements 121, 122 of the second retardation manipulator 120 each have mutually facing aspheric surfaces that have a constant distance from one another along the optical system axis (i.e. in the z-direction). Air, any desired gas or an adhesive can be located in the region of the relevant gap. Furthermore, the gap can also have a vanishing thickness, such that the respective partial elements can also be arranged in direct contact with respect to one another. The partial elements that belong to the same retardation manipulator each remain in fixed position with respect to one another and, to this end, remain fixed together in any desired fashion.

Furthermore, both the light entry surface of the third partial element 121 and the light exit surface of the fourth partial element 122 in the second retardation manipulator 120 each have a planar embodiment, and consequently the second retardation manipulator 120 leaves the wavefront of light that passes through it during the operation of the optical system having the arrangement (e.g. a microlithographic projection exposure apparatus) unchanged. This property is implemented in the example of FIG. 1 (without the disclosure being limited hereto) also in the light entry surface of the first partial element 111 and the light exit surface of the second partial element 112 of the first retardation manipulator 110. In further exemplary embodiments, the retardation manipulator that is fixed with respect to the optical system axis (i.e. the first retardation manipulator 110 in FIG. 1) can—as will be explained in more detail below with reference to FIG. 5$ff$.—also have at least one optically effective surface (light entry or light exit surface) having a refractive power (i.e. at least one non-planar surface).

In the exemplary embodiment of FIG. 1, the partial elements 111 and 122 of the first and second retardation manipulators 110, 120 are furthermore produced from optically uniaxial crystal material having an orientation of the optic axis that is perpendicular to the optical system axis (z-direction). Suitable materials to be mentioned by way of example are e.g. magnesium fluoride ($MgF_2$) or sapphire ($Al_2O_3$). The "+" symbol in each of the partial elements in FIG. 1 is intended to indicate that the two partial elements 111, 122 having a retardation effect of the same sign are made in the example from the same material (e.g. in each case from magnesium fluoride) and with the same orientation of the optic axis. The result of this, and of the fact that the thickness profiles of the partial elements 111 and 122 in a non-displaced position (i.e. "zero position") of the retardation manipulators 110, 120 are complementary, or inverse, with respect to one another, is that the sum of the retardation brought about by the first retardation manipulator 110 and of the retardation brought about by the second retardation manipulator 120 is constant in the direction (e.g. y-direction) that is perpendicular to the optical system axis, or z-direction. In other words, the sum of the retardations brought about by the first retardation manipulator 110 and the second retardation manipulator 120 coincides for all rays traveling parallel to the optical system axis during operation of the optical system.

In the exemplary embodiment of FIG. 1, the second partial element 112 of the first retardation manipulator 110 and the third partial element 121 of the second retardation manipulator 120 are furthermore each embodied such that they effect no retardation for light passing through them (which is indicated in FIG. 1 by a "0" symbol). In the exemplary embodiment of FIG. 1, this is achieved by way of the relevant partial elements 112 and 121 being likewise made from optically uniaxial crystal material, but in this case the optic axis in the partial elements 112 and 121 extends parallel to the optical system axis, or z-direction. This configuration has the advantage that the partial elements in each of the retardation manipulators 110, 120 can be each produced from the same crystal material (i.e. have the same refractive index), with the result that a respective wavefront effect due to different refractive indices is avoided. However, the disclosure is not limited thereto, and as a result, the relevant partial elements that in each case have no retardation effect (i.e. the partial elements 112 and 121 in accordance with FIG. 1) in further embodiments can also be produced from an optically isotropic material (e.g. quartz glass, $SiO_2$).

As a result, it is possible with the embodiment of FIG. 1 to selectively set a desired retardation profile, which is produced as a linear combination from two in each case fixed retardation profiles, by displacing the second retardation manipulator 120 in two directions (x-direction and y-direction) that are transverse to the optical system axis, or z-direction, starting from the "zero position" (i.e. that position in which the second retardation manipulator 120 is not displaced with respect to the first retardation manipulator 110 to achieve a constant retardation).

These two specified retardation basic profiles, which will be referred to below as also $b_x$ and $b_y$, are, for light in the direction of the optical system axis "z," approximately proportional to the partial derivations $$\frac{\partial}{\partial x}, \frac{\partial}{\partial y}$$

of the thickness profile h of the respective retarding partial element in the second retardation manipulator (corresponding to the partial element 122, 221, 321, 422, 522 and 622 in FIGS. 1 to 6):

$$b_x \propto (n_e - n_o) \cdot \frac{\partial h}{\partial x} \quad (1)$$

$$b_y \propto (n_e - n_o) \cdot \frac{\partial h}{\partial y} \quad (2)$$

wherein $n_e$ and $n_o$ indicate the two refractive indices of the birefringent crystal (extraordinary refractive index and ordinary refractive index). The basic profiles $b_x$ and $b_y$ therefore satisfy the (necessary and sufficient) condition of "irrotationality"

$$\frac{\partial}{\partial x} b_y - \frac{\partial}{\partial y} b_x = 0. \quad (3)$$

The direction of the retardation axis is constant here and determined by the optical axis (to refractive index $n_e$ or $n_o$). The amplitude of the retardation is settable as $x \cdot b_x + y \cdot b_y + b_0$, wherein (x, y, c) designates the displacement vector transverse to the optical system axis OA (=z-direction in the Cartesian coordinate system) and $b_0$ designates the total retardation of the two manipulators for the zero position (x, y, c)=0. Preferably, c=0 and $b_0$=0, the latter being achieved in alternative configurations FIGS. 3-6, which will be specified in more detail below.

FIG. 2 shows in schematic illustration a further embodiment, wherein the retardation manipulators or the partial elements thereof are designated by reference numerals increased by "100" as compared to FIG. 1. As compared to FIG. 1, only the partial elements 221 and 222 are switched in terms of their configuration with or without retardation effect. Accordingly, the geometry of the third partial element 221 is formed to be complementary with respect to that of the first partial element 211, with the result that the total thickness of both partial elements 211, 221 with respect to the z-direction in the non-displaced state (shown in FIG. 2) of the second retardation manipulator 220 is constant. Consequently, in accordance with FIG. 2, the sum of the retardations brought about by the two retardation manipulators 210, 220 also coincides for all rays traveling parallel to the optical system axis, or z-axis, during operation of the optical system having the arrangement in the starting position ("zero position" without displacement of the second retardation manipulator 220).

Figure 3:
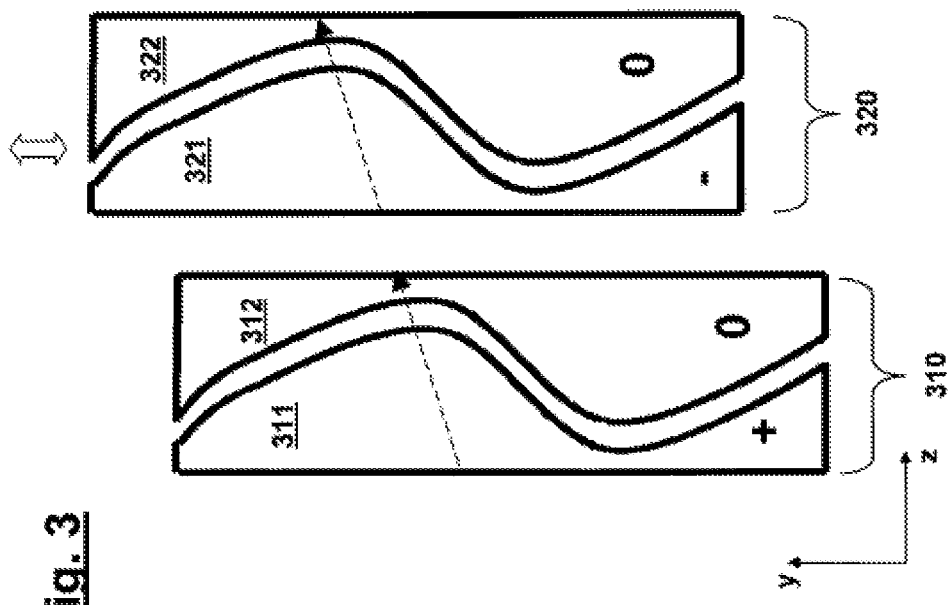

FIG. 3 shows a further possible embodiment, wherein the relevant retardation manipulators or the partial elements are designated by reference numerals increased by "200" as compared to FIG. 1. In contrast to FIG. 1, the third partial element 321 is here embodied not without retardation effect, but with a retardation effect that is inverse with respect to the first partial element 311, with the result that, due to the coinciding geometry, the sum of the retardations of the first partial element 311 and of the third partial element 321 for the starting position, or zero position (i.e. in which the second retardation manipulator 320 is not displaced with respect to the optical system axis), is here zero.

This is achieved in the exemplary embodiment of FIG. 3 by way of the partial element 321 being produced from the same optically uniaxial crystal material as the partial element 311, but wherein the optic axis in the partial element 321 extends perpendicular to the optic axis in the first partial element 311. For example, the optic axis in the third partial element 321 can be oriented in the x-direction, and the optic axis in the first partial element 311 can be oriented in the y-direction. In further embodiments, the relevant partial elements can also be produced from optically uniaxial material with opposite character (wherein e.g. the third partial element 321 can be produced from optically negatively uniaxial material and the third partial element 311 from optically positively uniaxial material) to achieve the desired retardation effect.

In accordance with FIG. 3, the respectively other partial elements of the first and second retardation manipulators 310, 320 (i.e. the second partial element 312 and the fourth partial element 322) are furthermore in turn embodied each without retardation effect. This can be done, analogously to the previously described embodiments, by way of the second partial element 312 being formed from the same crystal material as the first partial element 311, but with an orientation of the optic axis that is parallel to the optical system axis, or z-direction, while the fourth partial element 322 is formed from the same crystal material as the third partial element 321, but with an orientation of the optic axis that is parallel to the optical system axis, or z-direction.

FIG. 4 shows a further variant, in which the embodiment, described above with reference to FIG. 3, of the partial element having retardation effect is realized within the second retardation manipulator 420 for the fourth partial element 422, with the result that here the total sum of the retardations brought about by the first partial element 411 and the fourth partial element 422 for the starting position, or zero position (i.e. in which the second retardation manipulator 420 is not displaced with respect to the optical system axis), is here zero.

The embodiments of FIG. 3 and FIG. 4 consequently have in common that in the above-described starting position (with "non-displaced" second retardation manipulator), the entire retardation of the two retardation manipulators is not only constant over the light beam cross section (as in FIG. 1 and FIG. 2), but vanishes completely. These embodiments are therefore suitable in particular for polychromatic retardation correction.

In the embodiments described above with reference to FIGS. 1-4, it is additionally or alternatively also possible, in addition to the respectively second retardation manipulator, for the first retardation manipulator to be embodied to be displaceable transversely to the optical system axis, or z-direction, by a manipulator (not illustrated in the respective figures). Furthermore, in the embodiments described above with reference to FIGS. 1-4, it is possible to carry out a switch of the "0" elements and the "+" and/or "−" elements in the retardation manipulators in each case on both sides.

Figure 5:
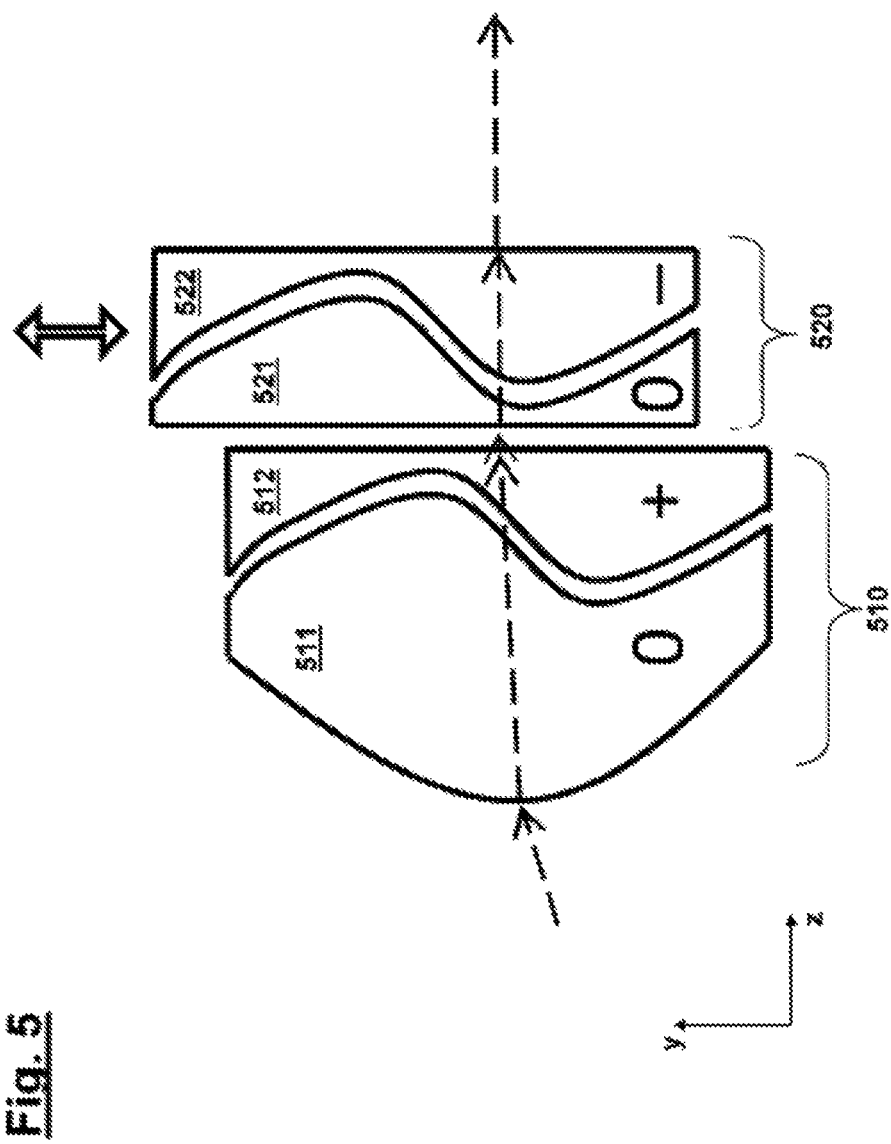

FIG. 5 shows a further embodiment, wherein the respective retardation manipulators or the partial elements are designated by reference numerals increased by "400" as compared to FIG. 1. The embodiment in accordance with FIG. 5 differs from that from FIG. 4 in particular in that the first retardation manipulator 510, specifically the first partial element 511 thereof, has a non-planar light entry surface (which is convexly formed in the exemplary embodiment). Consequently, in contrast to the embodiments described above with reference to FIGS. 1-4, the first retardation manipulator 510 has a non-vanishing, average refractive power. Due to this refractive power, the relevant retardation manipulator 510, if it is appropriately placed in the optical system, can optionally make a desired contribution to the optical beam path, i.e. can assume an additional function by way of a corresponding integration in the optical system. This first partial element 511 in accordance with FIG. 5 is furthermore a partial element without retardation effect (i.e., in particular analogously to the previously described embodiments, made from optically uniaxial crystal material having an orientation of the optic axis that is parallel to the optical system axis, or z-axis). As for the rest, the partial elements 512 and 522 in FIG. 5 are the partial elements that mutually compensate for one another with respect to their retardation effect in the starting position, or zero position, of the second retardation manipulator 520 (such that they are to this extent analogous to the partial elements 411, 422 from FIG. 4).

Figure 6:
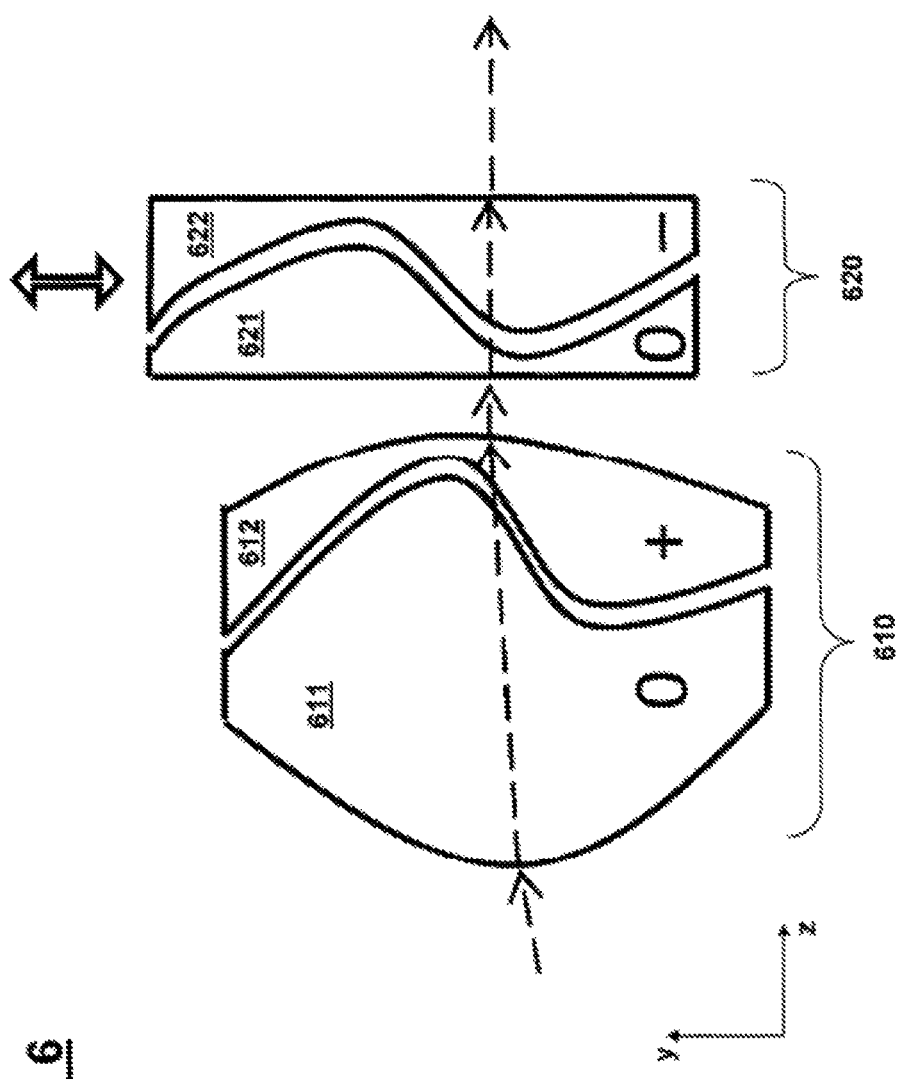

FIG. 6 shows a further embodiment, which differs from that from FIG. 5 in that in this case, in addition, the second partial element 612 of the first retardation manipulator 610 also has a non-planar light exit surface.

Figure 7:
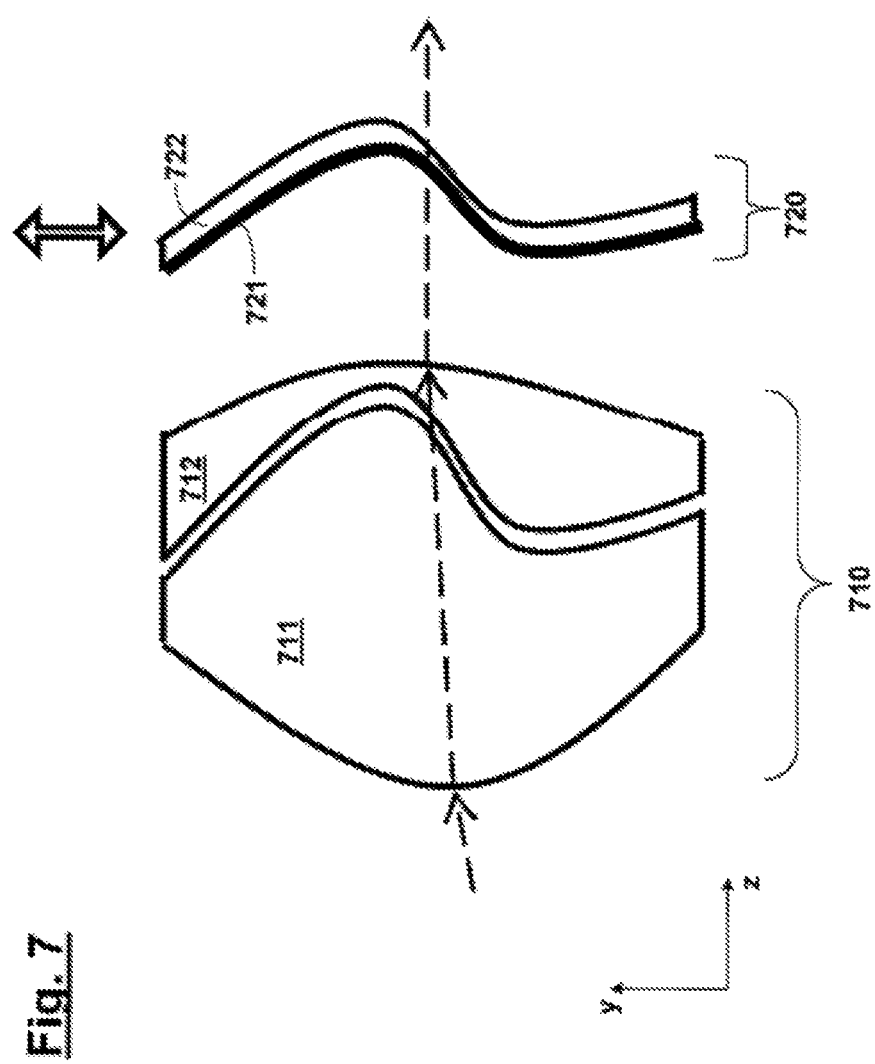

FIG. 7 shows a further embodiment, which differs from that from FIG. 6 in that the retardation brought about by the second retardation manipulator 720 is caused by a coating 721. In this case, the desired retardation effect is set by suitably selecting layer material, layer thickness and geometry or profile of the angle of incidence in the respective layer system. To this end, the coating 721 is disposed on a carrier 722 which provides the corresponding geometry, or aspheric surface shape. In accordance with FIG. 8, both retardation manipulators 810, 820 can have the previously described embodiment.

The coating materials are preferably themselves birefringent (i.e. by way of column formation during vapor deposition), wherein, in contrast to the embodiments described above with reference to FIG. 1 to FIG. 6, multi-layers from isotropic materials even have retardation at greater angles of incidence as a result of different reflectances for s-polarization and p-polarization. For a layer from exactly two isotropic materials, the retardation is approximately quadratic in the sine of the angle of incidence, proportional to the refractive index difference between the two materials, and monotonically increasing in the number of coating bilayers.

To achieve sufficient retardations, the above parameters should be selected to be as high as possible, without too strongly impairing the transmittance. In contrast to the embodiments described above with reference to FIG. 1 to FIG. 6, the height profile h or −h of the retardation manipulators determines not only the amplitude of the retardation profile, but also the orientation of the retardation, specifically in the direction of the gradient of h. Compatibility with x-displacements therefore involves a height profile which is constant in the y-direction, such that one degree of freedom for correction is dispensed with. The retardation effect is then approximately proportional to $$\frac{\partial}{\partial x}\left(\left(\frac{\partial h}{\partial x}\right)^2\right)$$

for homogeneous coatings.

Coating materials having a high refractive index difference which may be used for ultraviolet light from 190 nm are e.g. magnesium fluoride ($MgF_2$) and lanthanum trifluoride ($LaF_3$). One possible embodiment has e.g. a layer with at least four sublayers of an alternating layer sequence of magnesium fluoride ($MgF_2$) and lanthanum trifluoride ($LaF_3$), which is optimized proceeding from the typical quarter-wave layers depending on the substrate by varying the thicknesses to maximum transmittance and retardation.

Figure 8:
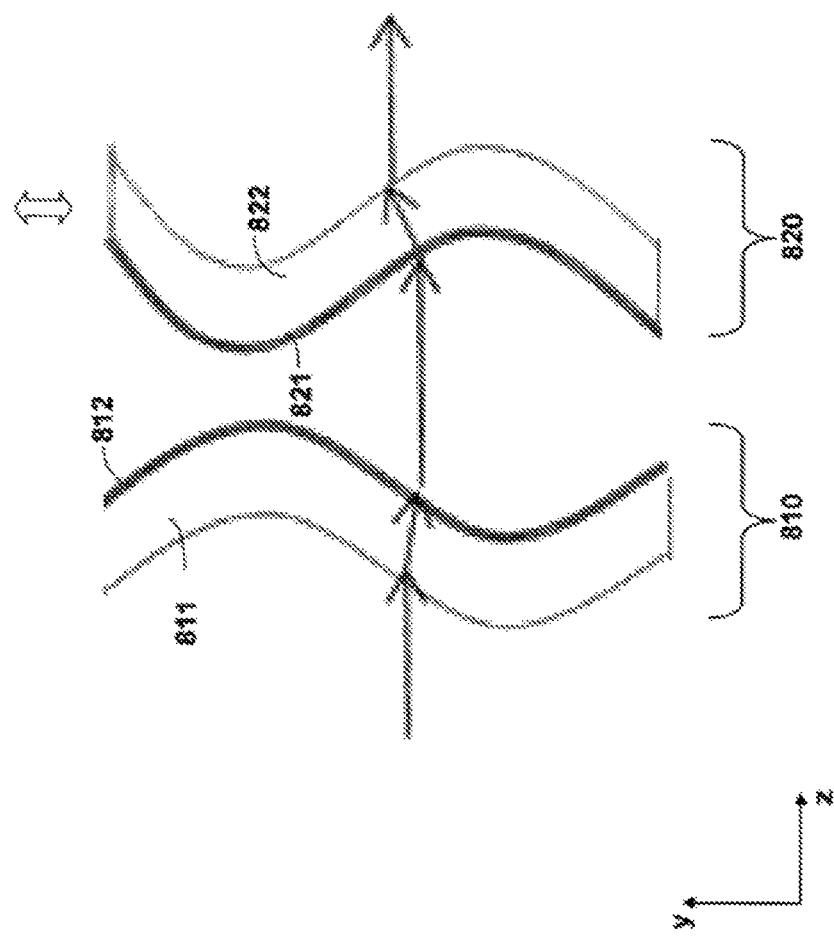

The embodiments of FIG. 7 and FIG. 8 have in common with the previously described embodiments of FIG. 1 to FIG. 6 that the sum of the retardation brought about by the two retardation manipulators 710, 720 or 810, 820 in the starting position, or "zero position" (with the second retardation manipulator 720 or 820 not displaced with respect to the optical system axis), likewise coincides for all rays traveling parallel to the optical system axis, or z-direction. By displacing the respectively second retardation manipulator 720, 820 relative to the optical system axis, it is again possible to set any desired amplitude of a specified basic profile, but not a linear combination of two linearly independent profiles.

Figure 9:
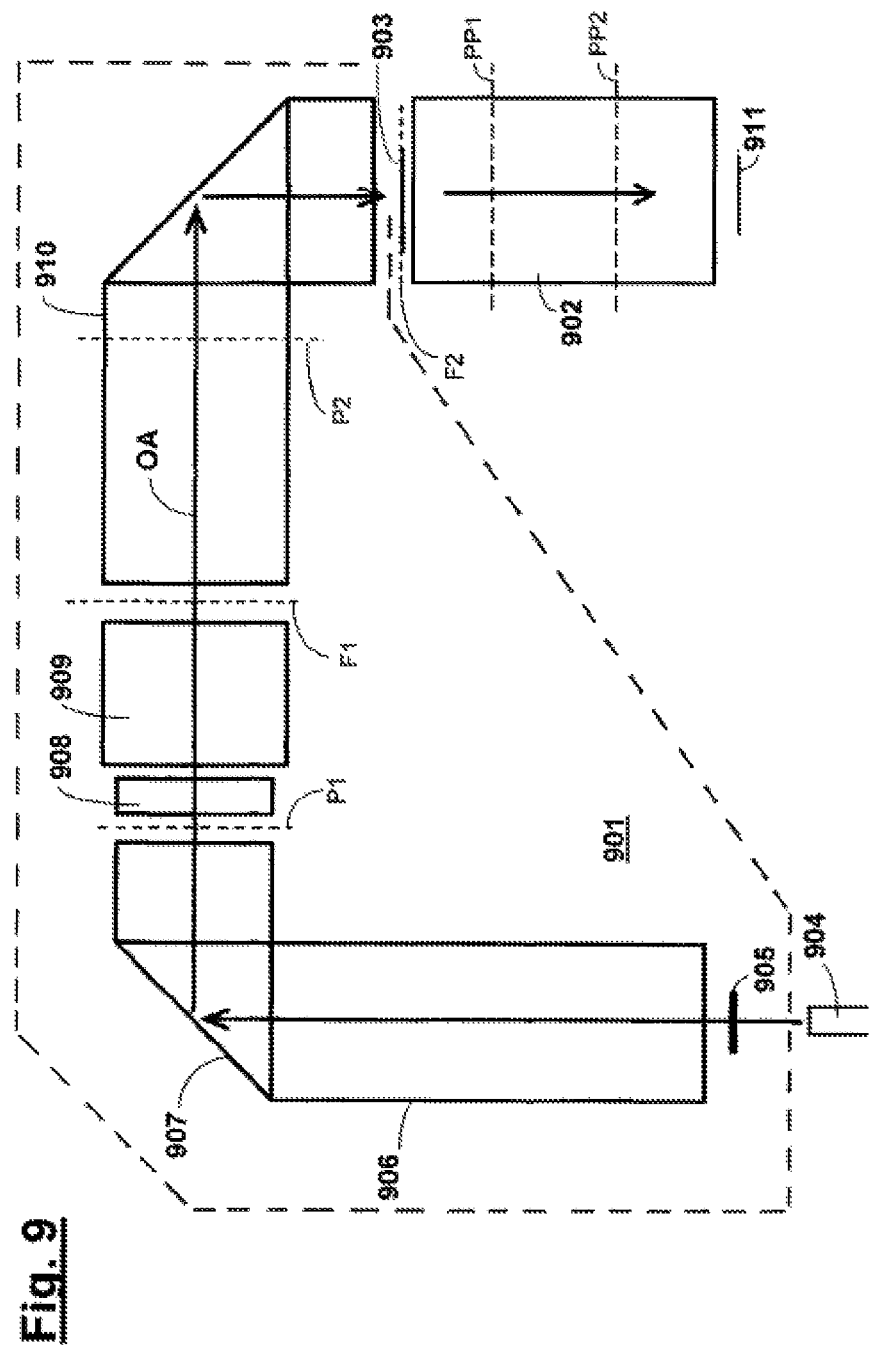
FIG. 9 shows a schematic illustration of the possible construction of a microlithographic projection exposure apparatus.

FIG. 9 shows, merely in a schematic illustration, the basic design of a microlithographic projection exposure apparatus in accordance with one embodiment of the disclosure. The concept according to the disclosure can here be realized in the same way both in the illumination device and in the projection lens.

The microlithographic projection exposure apparatus includes an illumination device 901 and a projection lens 902. The illumination device 901 serves to illuminate a structure-carrying mask (reticle) 903 with light from a light-source unit 904, which e.g. includes an ArF laser for an operating wavelength of 193 nm and a beam shaping optical unit producing a parallel light beam. The parallel pencil of rays from the light-source unit 904 is first incident on a diffractive optical element 905, which produces a desired intensity distribution (e.g. dipole or quadrupole distribution) via an angle radiation pattern that is defined by the respective diffractive surface structure in a pupil plane P1. Situated downstream of the diffractive optical element 905 in the light propagation direction is an optical unit 906, which has a zoom lens which produces a parallel light beam with a variable diameter and an axicon. The zoom lens is used in connection with the upstream diffractive optical element 905 to produce different illumination configurations in the pupil plane P1 depending on the zoom setting and position of the axicon elements. The optical unit 906 in the illustrated example furthermore includes a deflecting mirror 907. Situated downstream of the pupil plane P1 in the light propagation direction is, in the beam path, a light-mixing device 908, which can have e.g. in a manner which is known per se an arrangement of micro-optical elements which is suitable for achieving light mixing. Following the light-mixing device 908 in the light propagation direction there is a lens group 909, behind which a field plane F1 with a reticle masking system (REMA) is situated, the latter being imaged by a REMA lens 910, which follows in the light propagation direction, onto the structure-carrying mask (reticle) 903 arranged in the field plane F2, and, as a consequence, restricting the illuminated region on the reticle. The structure-carrying mask 903 is imaged by the projection lens 902, which in the illustrated example has two pupil planes PP1 and PP2, onto a substrate 911 having a light-sensitive layer, or a wafer. Examples of suitable positions for placing an arrangement of retardation manipulators according to the disclosure are pupil-near, image-near or intermediate-image-near positions or intermediary positions.

Even though the disclosure has been described on the basis of specific embodiments, numerous variations and alternative embodiments are apparent to a person skilled in the art, for example by combination and/or exchange of features of individual embodiments. Accordingly, it goes without saying for a person skilled in the art that such variations and alternative embodiments are concomitantly encompassed by the present disclosure, and the scope of the disclosure is restricted only within the meaning of the accompanying patent claims and the equivalents thereof.

What is claimed is:

1. An optical system having an optical system axis, the optical system comprising:
a first retardation manipulator comprising two partial elements that are fixed relative to each other;
a second retardation manipulator comprising two partial elements that are fixed relative to each other; and
a manipulator configured to displace the second retardation manipulator independently of the first retardation manipulator in a direction that is transverse to the optical system axis,
wherein:
the second retardation manipulator is configured so that, during use of the optical system, a wavefront of light that passes through the second retardation manipulator is unchanged;
the first and second retardation manipulators are configured so that, during use of the optical system in a specified starting position of the first retardation manipulator and of the second retardation manipulator, a sum of retardations caused by the first retardation manipulator and the second retardation manipulator coincides for all rays that travel parallel to the optical system axis;
the optical system is a microlithographic projection exposure apparatus optical system or of a wafer inspection apparatus optical system;
the first retardation manipulator comprises a light entry surface;
during use of the optical system, light impinges on the light entry surface of the first retardation manipulator before impinging on any other surface of the first retardation manipulator; and
the light-entry surface of the first retardation manipulator is non-planar.

2. The optical system of claim 1, wherein the optical system is configured so that, during use of the optical system, a retardation which exists at another location in the optical system is at least partially compensated for by the arrangement of the first and second retardation manipulators.

3. The optical system of claim 1, wherein the first and second retardation manipulators are configured so that, during of the optical system in the specified starting position of the first retardation manipulator and of the second retardation manipulator, the sum of the retardations effected by the first retardation manipulator and the second retardation manipulator is zero or an integer multiple of the operating wavelength.

4. The optical system of claim 1, wherein the manipulator is configured to displace the second retardation manipulator in two mutually perpendicular directions that are each transverse to the optical system axis.

5. The optical system of claim 1, wherein, for each of the first and second retardation manipulators: one of the partial elements is configured to effect a retardation for light passing through it; and the other partial element configured so that it does not effect retardation for light passing through it.

6. The optical system of claim 1, wherein, for each of the first and second retardation manipulators, the partial elements are configured to mutually compensate each other in their wavefront effects.

7. The optical system of claim 1, wherein, for at least one retardation manipulator selected from the group consisting of the first retardation manipulator and the second retardation manipulator, the partial elements have mutually facing aspheric surfaces which have a constant distance along the optical system axis.

8. The optical system of claim 1, wherein, for each of the first and second retardation manipulators, one the partial elements comprises optically uniaxial crystal material with an orientation of the optic axis that is perpendicular to the optical system axis.

9. The optical system of claim 1, wherein:
for each of the first and second retardation manipulators, one the partial elements comprises optically uniaxial crystal material with an orientation of the optic axis that is perpendicular to the optical system axis; and
the optic axis of the one of the partial elements of the first retardation manipulator is perpendicular to the optic axis of the one of the partial elements of the second retardation manipulator.

10. The optical system of claim 1, wherein the partial elements of the first retardation manipulator comprise optically uniaxial crystal material with an orientation of the optic axis that is parallel to the optical system axis, and the partial elements of the second retardation manipulator comprise optically uniaxial crystal material with an orientation of the optic axis that is parallel to the optical system axis.

11. The optical system of claim 1, wherein the optical system is configured so that, during use of the optical system, a retardation which exists at another location in the optical system is at least partially compensated for by the arrangement of the first and second retardation manipulators.

12. The optical system of claim 1, wherein the first and second retardation manipulators are configured so that, during of the optical system in the specified starting position of the first retardation manipulator and of the second retardation manipulator, the sum of the retardations effected by the first retardation manipulator and the second retardation manipulator is zero or an integer multiple of the operating wavelength.

13. The optical system of claim 1, wherein at least one of the retardation manipulators comprises a coating configured to produce the retardation.

14. An apparatus, comprising:
an illumination device; and
a projection lens,
wherein at least one member selected from the group consisting of the illumination device and the projection lens comprises an optical system according to claim 1, and the apparatus is a microlithographic projection exposure apparatus.

15. An apparatus, comprising:
an illumination device; and
a projection lens,
wherein at least one member selected from the group consisting of the illumination device and the projection lens comprises an optical system according to claim 1, and the apparatus is a wafer inspection apparatus.

16. A method, comprising:
providing a substrate to which a layer composed of a light-sensitive material is at least partly applied;
providing a mask comprising structures to be imaged;
providing a microlithographic projection exposure apparatus comprising an illumination device and a projection lens; and
projecting at least one part of the mask onto a region of the layer with the aid of the projection exposure apparatus,
wherein at least one member selected from the group consisting of the illumination device and the projection lens comprises an optical system according to claim 1.

17. The optical system of claim 1, wherein:
the second retardation manipulator comprises a light entry surface;
during use of the optical system, light impinges on the light entry surface of the second retardation manipulator before impinging on any other surface of the second retardation manipulator; and
the light-entry surface of the second retardation manipulator is non-planar.

18. The optical system of claim 1, wherein, during use of the optical system, light impinges on the first retardation manipulator before light impinges on the second retardation manipulator.

19. An optical system having an optical system axis, the optical system comprising:
a first retardation manipulator comprising two partial elements that are fixed relative to each other;
a second retardation manipulator comprising two partial elements that are fixed relative to each other; and
a manipulator configured to displace the second retardation manipulator independently of the first retardation manipulator in a direction that is transverse to the optical system axis,
wherein:
the second retardation manipulator is configured so that, during use of the optical system, a wavefront of light that passes through the second retardation manipulator is unchanged;
the first and second retardation manipulators are configured so that, during use of the optical system in a specified starting position of the first retardation manipulator and of the second retardation manipulator, a sum of retardations caused by the first retardation manipulator and the second retardation manipulator coincides for all rays that travel parallel to the optical system axis; and
the optical system is a microlithographic projection exposure apparatus optical system or of a wafer inspection apparatus optical system.

* * * * *